(12) United States Patent  (10) Patent No.: US 8,502,333 B2
Baek  (45) Date of Patent: Aug. 6, 2013

(54) DISPLAY DEVICE UTILIZING CONDUCTIVE ADHESIVE TO ELECTRICALLY CONNECT IC SUBSTRATE TO NON-DISPLAY REGION AND MANUFACTURING METHOD OF THE SAME

(75) Inventor: Myoung-Kee Baek, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 164 days.

(21) Appl. No.: 12/962,172

(22) Filed: Dec. 7, 2010

(65) Prior Publication Data

US 2011/0147748 A1  Jun. 23, 2011

(30) Foreign Application Priority Data

Dec. 21, 2009  (KR) .......................... 10-2009-0127943

(51) Int. Cl.
 *H01L 31/0203* (2006.01)
 *H01L 31/18* (2006.01)
(52) U.S. Cl.
 USPC .... 257/433; 257/448; 257/738; 257/E31.111; 257/E31.126; 438/64; 438/98
(58) Field of Classification Search
 USPC ................... 257/E31.111, E31.113
 See application file for complete search history.

(56) References Cited

U.S. PATENT DOCUMENTS

| | | | | |
|---|---|---|---|---|
| 7,294,873 | B2 * | 11/2007 | Suzuki et al. ................. | 257/225 |
| 7,576,825 | B2 * | 8/2009 | Jung ............................ | 349/152 |
| 2009/0279011 | A1 * | 11/2009 | Baek et al. ..................... | 349/46 |

FOREIGN PATENT DOCUMENTS

| | | |
|---|---|---|
| CN | 1794071 | 6/2006 |
| KR | 10-2005-0104131 | 11/2005 |
| KR | 10-2008-0114355 | 12/2008 |

* cited by examiner

*Primary Examiner* — Stephen W Smoot
(74) *Attorney, Agent, or Firm* — McKenna Long & Aldridge, LLP

(57) ABSTRACT

A display device and a fabricating method of the same are disclosed. The display device includes a first substrate comprising a display region defined in a center thereof and a non-display region defined in an outer area thereof, the display region comprising a thin film layer transistor array and the non-display region comprising a pad electrode; an IC substrate opposed to a predetermined area of the non-display region; a circuit pad electrode formed on the IC substrate; a step pattern formed on the circuit pad electrode, the step pattern made of an organic dielectric layer; a circuit pad contact hole formed in the step pattern the to partially expose the circuit pad electrode; a transparent circuit pad electrode formed on the step pattern including the circuit pad contact hole; and a conductive adhesive formed between the first substrate and the IC substrate, the conductive adhesive comprising conductive balls to electrically connect the transparent circuit pad electrode and the pad electrode with each other.

20 Claims, 9 Drawing Sheets

DISPLAY DEVICE UTILIZING CONDUCTIVE ADHESIVE TO ELECTRICALLY CONNECT IC SUBSTRATE TO NON-DISPLAY REGION AND MANUFACTURING METHOD OF THE SAME

CROSS REFERENCE TO RELATED APPLICATION

This application claims the benefit of the Patent Korean Application No. 10-2009-127943, filed on Dec. 21, 2009, which is hereby incorporated by reference as if fully set forth herein.

BACKGROUND OF THE DISCLOSURE

1. Field of the Disclosure

The present invention relates to a display device, more particularly, to a display device which changes a structure of an IC substrate to gain an enough step, when bonding a drive IC fabricated by using LDIC technology with a substrate of the display device made of an IC substrate and a glass substrate, and a fabricating method of the same.

2. Discussion of the Related Art

As the information age has started in earnest, a display field used to express an electrical information signal visually has been developed drastically. Together with that, a variety of flat display devices having excellent functions of slimming, reduced weights and low electricity consumption has been developed and they replace conventional cathode ray tube (CRT) devices rapidly.

Such a flat display device includes a liquid crystal display device (LCD), a plasma display panel device (PDP), a field emission display device (FED), an electro luminescence display device (ELD) and the like. They are commonly configured of a flay display panel to present images and this flat display panel has a couple of transparent insulating substrates boned with each other with a luminescent or polarizing material layer formed there between.

The liquid crystal display device (LCD) displays images by controlling light transmissivity of liquid crystal by way of an electric field. For that, the liquid crystal display device includes a liquid display panel having liquid crystal cells, a back light unit configured to emit lights to the display panel and a driving circuit configured to the liquid crystal cells.

A plurality unit pixel regions are defined and formed in the liquid crystal display panel by gate lines and data lines alternatively aligned to each other. At this time, each pixel region includes a thin film transistor array substrate, a color filter array substrate, a spacer located between the two substrates to maintain a cell gap and liquid crystal filled in the cell gap.

The thin film array substrate is configured of gate lines and data lines, a thin film transistor formed in each cross point of the gate and data lines as switch device, a pixel electrode connected with the thin film transistor with being formed in liquid crystal cell units, and an alignment layer coated thereon. The gate and data lines receive a signal from driving circuits via pad parts, respectively.

The thin transistor transmits a pixel voltage signal supplied to the data lines to the pixel electrode in response to a scan signal supplied to the gate lines.

The color filter substrate is configured of color filters formed in the liquid crystal cell units, a black matrix configured to distinguish color filters from each other and to reflect external lights, common electrodes configured to supply a reference voltage to each of the liquid crystal cells commonly and an alignment layer coated thereon.

After the thin film transistor substrate and the color filter array substrate fabricated independently as mentioned above are alignedly bonded to each other in opposite, the liquid crystal is injected and sealed.

The driving circuit of such the liquid crystal display device includes a gate driver configured to drive the gate lines of the liquid crystal panel, a data driver configured to drive the dater lines, a timing controller configured to control driving timings of the gate driver and the data driver and a power supply unit configured to supply voltage signals required to drive the driving circuits and the liquid crystal panel.

The data driver and the gate driver are divided into a plurality of integrated circuits (IC) to be fabricated as chip type.

Each of the integrated circuits is embedded in an IC region open on a tape carrier package (TCP) or embedded in a base film of TCP based on chip-on-film (COF) and it is electrically connected with the liquid crystal panel based on tape automated bonding (TAB). Also, a drive IC may be directly embedded in the liquid crystal panel based on chip on Glass (COG).

The timing controller and the power supply unit are fabricated as chip type and they are embedded on a main printed circuit board (PCB).

As follows, a pad part forming method of a conventional liquid crystal display device will be described in reference to the accompanying drawings.

FIGS. 1A to 1F are process sectional views illustrating the pad part forming method of the conventional liquid crystal display device.

Figure 1A:
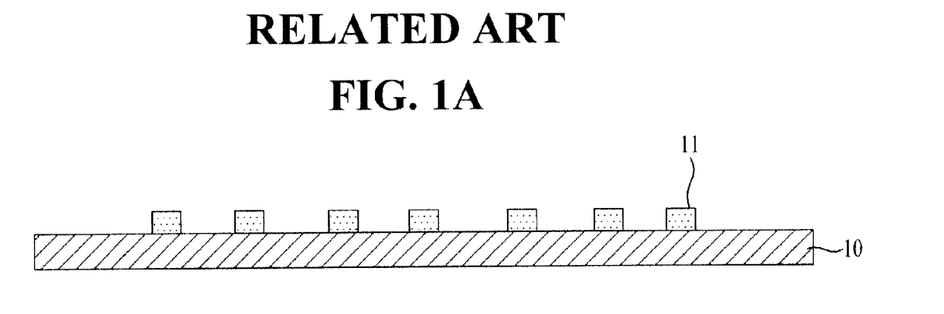
FIGS. 1A to 1F are sectional views illustrating a method of forming a pad part of a conventional liquid crystal display device.

As shown in FIG. 1A, a pad metal 11 is formed on a pad part 10 of a lower substrate including the thin transistor array.

Figure 1B:
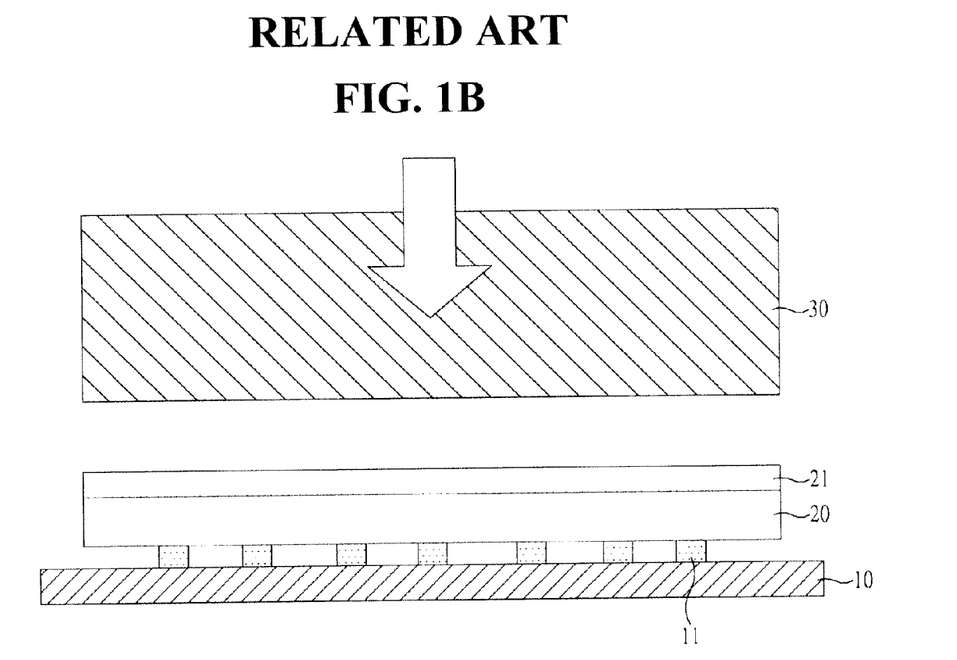
Figure 1C:
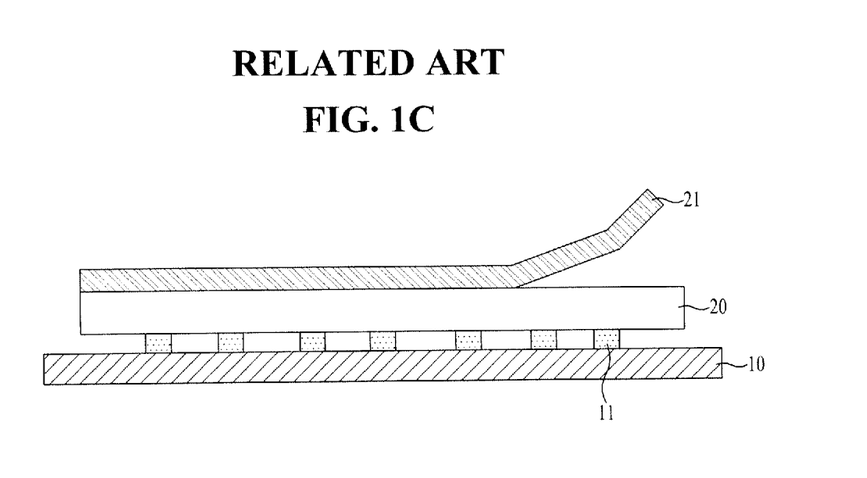

As shown in FIG. 1B, a conductive adhesive 20 is opposed to a surface having the pad metal 11 formed therein and a pressing device 30 applies weak pressure and heat to the surface and the conductive adhesives 20 to implement pre-bonding. At this time, a protection film 21 is attached to a surface of the pressing device 30 in contact with the conductive adhesive 20 and the protection film 21 is detached from the conductive adhesive 20 in a process shown in FIG. 1C.

Figure 1D:
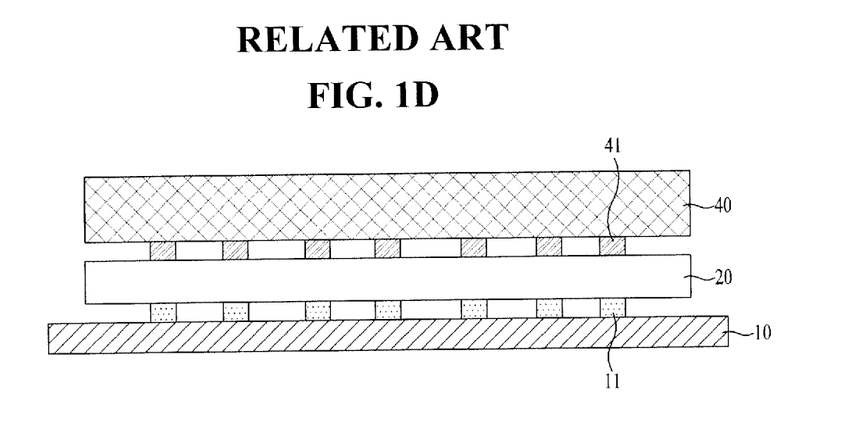

As shown in FIG. 1D, a semiconductor IC 40 having a bump 41 is opposed on a substrate 10 having the conductive adhesive 20 placed thereon. In this case, the conductive adhesive 20 faces the bump 41. This bump may be made of metal material such as Nickel, Copper and the like and it has a height of n-μm.

Figure 1E:
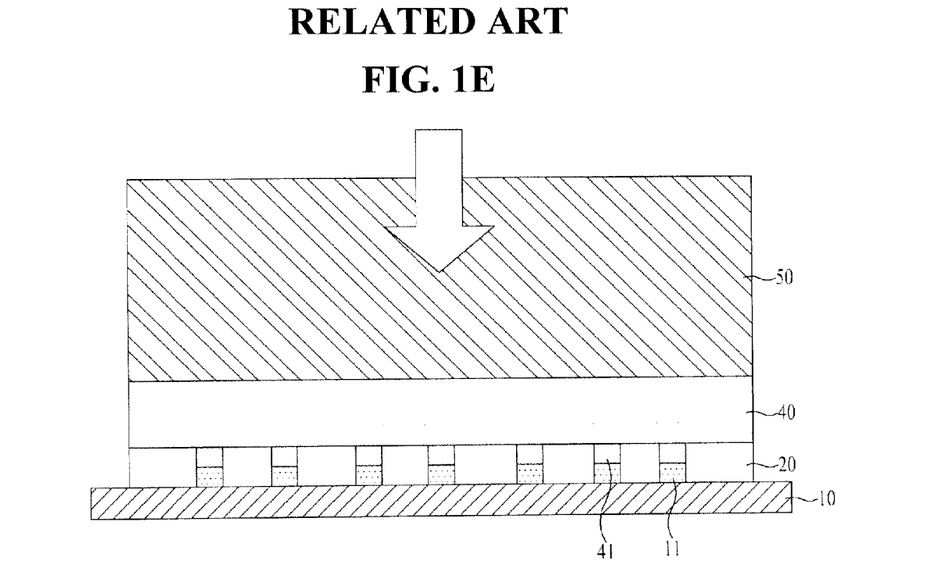
Figure 1F:
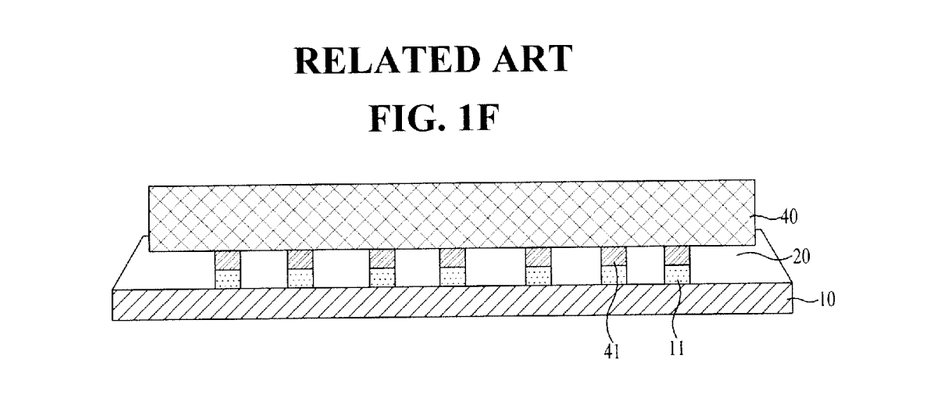

As shown in FIG. 1E, stronger pressure and heat than the pressure and heat in the process of FIG. 1B may be applied to the semiconductor IC 40 by using the pressing device 30 and a bonding process is implemented. In this process, the pressure is transmitted to bond a connection pad terminal 41 of the IC substrate 40 with a pad metal 11 placed on the substrate 10, and the pressed conductive adhesive 20 remains in the other area.

Here, not shown in the drawings, the conductive adhesive 20 includes a conductive ball and adhesive material. The conductive ball remains between the bump 41 of the metal material and the pad metal 11 to create electrical contact and the adhesive material is used as adhesive in the other area.

According to a conventional pad part formation process, bonding is implemented by using PCP (Tape Carrier Package) or COF (Chip On Film) having the typical semiconductor IC mounted therein. In case of the semiconductor IC, conductive adhesive having quite a thickness is used in the bonding process to gain a step required in the bonding process.

In the meanwhile, recently, LDIC (Low Temperature Poly Silicon Driver Integrated Circuit) technology has been under development. According to the LDIC, a drive IC is formed on a glass substrate based on LTPS (Low Temperature Poly Silicon) and the drive IC is attached to a liquid crystal panel.

However, when the substrate having the drive IC mounted therein is attached to a lower substrate of the liquid crystal panel, uniformity of the pad part cannot be accomplished, with weak contact.

SUMMARY OF THE DISCLOSURE

Accordingly, the present invention is directed to a display device and a fabricating method of the same.

The conventional liquid display device and the pad part and the fabricating method have following disadvantages.

First of all, to attach a drive IC substrate or an IC substrate for a specific function manufactured in a low temperature poly silicon forming process to a display panel, it is impossible to use the IC formed on a conventional semiconductor wafer as it is.

For example, to electrically bond the IC substrate with the display panel, a metal bump is formed on a semiconductor wafer and at this time, electroplating is used. It is difficult to implement the electroplating on a glass substrate because damage to the glass substrate might occur.

Furthermore, to bond LDIC having IC formed on the glass substrate with the substrate, the LDIC having a metal bump requires a pressing process. At this time, glass substrate damage of the LDIC occurs and it is difficult to implement the pressing process for the metal bump of the LDIC accordingly.

As a result, it is impossible to implement such the process in the LDIC having the glass substrate and another method is required when using the drive IC substrate formed of a glass substrate.

The present invention is invented to solve these problems, an object of the present invention is to provide a display device which changes a structure of an IC substrate to gain an enough step, when bonding a drive IC fabricated by using LDIC technology with a substrate of the display device made of an IC substrate and a glass substrate, and a fabricating method of the same.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a first substrate comprising a display region defined in a center thereof and a non-display region defined in an outer area thereof, the display region comprising a thin film layer transistor array and the non-display region comprising a pad electrode; an IC substrate opposed to a predetermined area of the non-display region defined in the first substrate; a circuit pad electrode formed on the IC substrate; a step pattern formed on the circuit pad electrode, the step pattern configured of an organic dielectric layer; a circuit pad contact hole formed of an organic dielectric layer; a circuit pad contact hole formed in the step pattern to partially expose the circuit pad electrode; a transparent circuit pad electrode formed on the step pattern including the circuit pad contact hole; and a conductive adhesive formed between the first substrate and the IC substrate, the conductive adhesive comprising conductive balls to electrically connect the transparent circuit pad electrode and the pad electrode with each other.

The step pattern may be formed of multi-layered organic dielectric layer having double or more layers.

The display device may further include an inorganic dielectric layer formed under the step pattern, except the circuit pad contact hole.

The IC substrate may be a glass substrate.

The display device may further include a second substrate having a color filter array formed therein, opposing to the display region of the first substrate.

The pad electrode may include a plurality of metal pad electrodes, a plurality of transparent pad electrodes connected with the metal pad electrodes, a pad contact hole formed in a connection area of an inter layer between the metal pad electrodes and the transparent pad electrodes, and a step generation hole formed between the metal pad electrodes.

A dummy poly silicon layer may be formed below the metal pad electrodes and a plurality of gate dummy patterns may be formed corresponding to the metal pad electrodes.

A gate dielectric layer may be formed between the dummy poly silicon layer and the gate dummy patterns and an interlayer dielectric layer may be formed between the gate dummy patterns and the metal pad electrodes.

At least one of the double or more layers of the organic dielectric layer may be made of photosensitive acryl resin.

One of the double or more layers of the organic dielectric layer may be made of black matrix resin.

One of the double or more layers of the organic dielectric layer may be color filter pigment.

The thickness of the step pattern may be 1~8 μm.

In another aspect of the present invention, a fabricating method of a display device includes steps of: preparing a first substrate comprising a display region defined in a center thereof and a non-display region defined in an outer area thereof, the display region comprising a thin film layer transistor array and the non-display region comprising a pad electrode; preparing an IC substrate formed of a glass substrate; forming a plurality of circuit pad electrodes on the IC substrate; forming a step pattern formed of an organic dielectric layer on each of the circuit pad electrodes and forming a circuit pad contact hole configured to each of the circuit pad electrodes partially; forming transparent circuit pad electrodes on the step patterns having the circuit pad contact holes; and coating conductive adhesive between the first substrate and the IC substrate to oppose the transparent circuit pad electrode to the pad electrode of the first substrate and to bond the first substrate with the IC substrate, the conductive adhesive comprising conductive balls to enable electrical connection.

The step of forming the step pattern may includes multi-layering double or more layers of an organic dielectric layer sequentially.

The fabricating method may further include a step of forming an inorganic dielectric layer on the circuit pad electrodes, wherein the step pattern is below the double or more layers of the organic dielectric layer.

The fabricating method may further include steps of: forming a dummy poly silicon layer below the pad electrodes on the first substrate; forming a gate dielectric layer on the dummy poly silicon layer; forming a plurality of gate dummy patterns in a predetermined area of the gate dielectric layer, correspondingly below the pad electrodes, the plurality of the gate dummy patterns spaced apart a predetermined distance from each other; and forming an interlayer dielectric layer on the gate dielectric layer.

The step of forming the pad electrodes may include steps of: forming a plurality of metal pad electrodes spaced apart a predetermined distance from each other on the interlayer dielectric layer, correspondingly beyond the gate dummy patterns spaced a predetermined distance from each other; depositing a passivation layer on the interlayer dielectric layer having the metal pad electrodes and forming a pad contact hole configured to partially expose the metal pad electrodes and a step generation hole configured to expose an area between each two of the metal pad electrodes; and forming transparent pad electrodes connected with the metal pad electrodes in the pad contact holes.

The present invention has following advantages.

According to the display device and the fabricating method, a bump is formed in a pad part of a first substrate (thin film layer transistor array substrate) of a display device and uniformity may be improved.

Furthermore, the height of the pad part may be increased stably. As a result, when an IC substrate is bonded with a display panel, a pressure condition and the like may be controllable advantageously.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figures 2A, 2B:
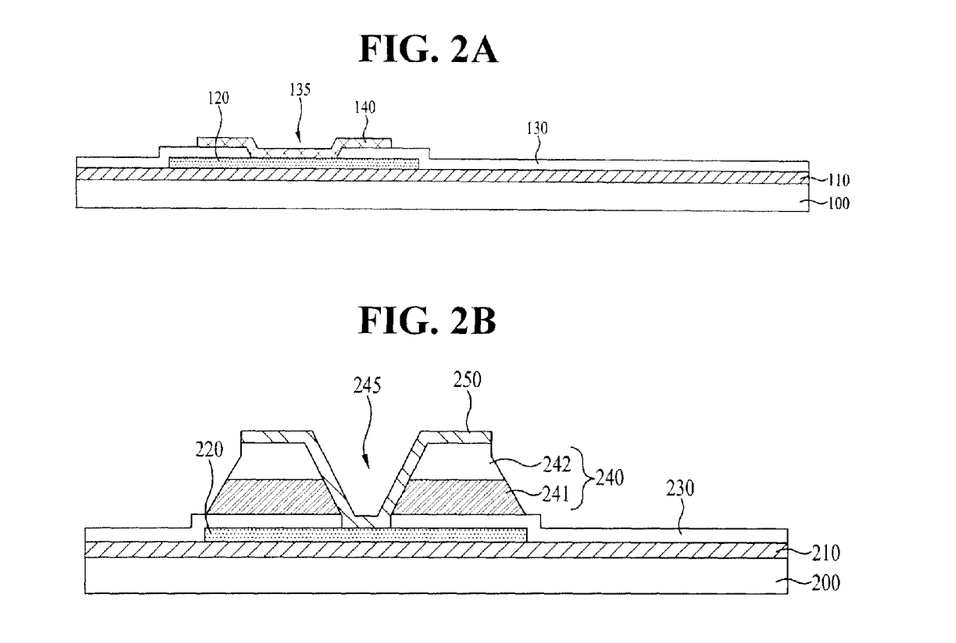
FIGS. 2A and 2B are sectional views illustrating an IC substrate and a substrate of a display device according to a first embodiment of a pad part forming method of a display device.

As follows, a pad part of a display device and a fabricating method of the same according to the present invention will be described in detail, First Embodiment FIGS. 2A and 2B are sectional views illustrating an IC substrate and a substrate of a display device according to an embodiment of the pad part forming method.

In the pad part forming method according to an exemplary embodiment of the present invention, a first substrate 100 is prepared and a first buffer layer 110 is formed as shown in FIG. 2A.

Here, the first substrate 100 is made of glass and a pad part is an outer portion of one of both substrates bonded to each other to form a display panel.

Here, a portion shown in the drawing is corresponding to a pad region of the first substrate 100 in which a thin film layer transistor array is formed. An outer portion of the first substrate 100 having the thin film layer array formed therein may be larger than an outer portion of the second substrate (not shown) opposed to the first substrate 100 and this large portion defines a pad part to apply an electric signal.

Hence, a thin film layer transistor array (not shown) including a semiconductor layer (not shown) formed of crystallized poly silicon is formed on the first substrate 100 having the first buffer layer 110 formed thereon and a metal pad electrode 120 is formed in the pad region, too.

That is, the first buffer layer 110 is used to protect the first substrate 100 when forming the semiconductor layer, specifically, to protect the first substrate 100 from laser crystallization or high temperature heat application required to form the poly silicon in a low temperature poly silicon forming process.

After that, a passivation layer 130 is deposited on a front surface of the first buffer layer 110 having the metal pad electrode 120 and the deposited passivation layer 130 is eliminated selectively to form a pad contact hole 135.

After a transparent electrode is deposited on the front surface having the pad contact hole 135, the deposited transparent electrode is eliminated selectively, to form a transparent pad electrode 140.

Here, if the display device is a liquid crystal display device, the thin film layer transistor array includes gate and data lines configured to define pixel regions, crossed with each other, gate electrodes formed in cross points between the gate and data lines, a semiconductor layer, a thin film layer transistor configured of a source/drain electrode and a pixel electrode formed in the pixel region, connected with the drain electrode.

In this case, the metal pad electrode 120 may be formed during the process of forming the gate or data lines and the transparent pad electrode 140 may be formed during the process of forming the pixel electrode.

The display device may be replaced with the other types of display devices rather than the liquid crystal display device, for example, OLED (Organic light emitting diode) display device, plasma display device, EPD (Electrophoretic Display) device and the like. In this case, the configuration of the array applied to each of the display device type may be changeable. In any case or each display device, the pad electrode should be provided to apply pixels and the pad electrode may be electrically bonded with an auxiliary IC substrate eventually. As a result, a pad part forming method which will be described later may be applicable to each type of the display devices.

As shown in FIG. 2B, an IC substrate 200 made of glass material is prepared and a second buffer layer 210 is deposited.

Hence, a circuit pad electrode 220 is formed in a predetermined region on the second buffer layer 210.

An inorganic dielectric layer 230 is deposited on the second buffer layer 210 having the circuit pad electrode 220 formed therein. Here, the reason why the inorganic dielectric layer 230 is provided is that first and second organic dielectric layers 241 and 242 formed on the glass IC substrate 200 or the second buffer layer 210 directly might be separated off and that a circuit pad electrode 220 located under the first and second organic dielectric layers 241 and 242 has to be protected when patterning the first and second organic layers.

Hence, first and second organic dielectric layers 241 and 242 are formed on the inorganic dielectric layer 230 sequentially.

After that, the first and second organic dielectric layers 241 and 242 are eliminated selectively and a step pattern 240 is formed. Here, the reason why the organic dielectric layer is coated on the inorganic layer in double-layers like the first and second organic dielectric layers 241 and 242 will be described. For example, when it is coated firstly, the organic dielectric layer is formed approximately below 3 µm or less and the organic dielectric layer is formed in double-layers to gain the enough thickness. Depending on cases, the number of the organic dielectric layers may be increased more according to the required thickness.

If the organic layer is formed in a single-layer, the organic dielectric layer is made of high viscosity material or negative photosensitivity material to gain the thickness of 3 µm or more.

Material of the first and second organic dielectric layers 241 and 242 may be black matrix resin, color filter paint or acryl organic dielectric elements or BCB (BenzoCycleButene). This organic dielectric layer may be photosensitive material.

In this case, the step pattern 240 may be corresponding to a pad part of the first substrate 100 in a bonding process of the IC substrate and a pattern is formed in the step pattern 240, to eliminate an upper portion of a center of the circuit pad electrode 220.

After the step pattern 240 is formed, the inorganic dielectric layer 230 on the center of the exposed circuit pad electrode 220 is eliminated, to form a circuit pad contact hole 245.

In this case, the step pattern forming and the inorganic dielectric layer patterning may be implemented by different masks or a single identical mask.

If the single identical mask is used, a diffraction exposure mask or half ton mask is used as will be described later.

That is, a transmission part for the center of the circuit pad electrode and a semi-transmission part for an upper portion except the center of the circuit pad electrode, and a shade part for the other region may be defined in the diffraction exposure mask or half ton mask.

The reason why the regions of the diffraction exposure mask or half ton mask are defined is that the first and second organic dielectric layer 241 and 242 are formed of positive photosensitivity material. If the first and second organic dielectric layers 241 and 242 are formed of negative photosensitivity material or not the material of the second inorganic dielectric layer 242, with a negative photosensitivity layer further provided for the patterning, the transmission part and the shade part of the mask may be opposite shapes.

As a result, the second organic dielectric layer 242 and the first organic dielectric layer 241 are exposed and developed by using the diffraction exposure mask or half ton mask, such that the image of the center of the circuit pad electrode 220 corresponding to the transmission part is eliminated firstly. Because of that, the circuit pad contact hole 245 is formed. In the above exposure and development process, the second and first organic dielectric layers 242 and 241 on a predetermined portion corresponding to the transmission part will be eliminated. Because of light amount difference, the second organic dielectric layer 242 remains in the portion corresponding to the semi-transmission part, in a state of being modified by the exposing and developing solution.

Hence, the inorganic dielectric layer 203 on the center of the exposed circuit pad electrode 220 is dry-etched and eliminated.

The modified second organic dielectric layer 242 on the portion corresponding to the semi-transmission part and the first organic dielectric layer 241 under the second organic dielectric layer 242 may be eliminated.

As mentioned above, a transparent electrode is deposited on the step pattern 240 configured of the patterned first and second organic dielectric layers 241 and 242 and on the second buffer layer 230 including the circuit pad contact hole 245. The deposited transparent electrode is eliminated selectively, to remain a transparent circuit pad electrode 250 corresponding to the circuit pad contact hole 245 and a portion adjacent to the circuit pad contact hole 245.

Here, the reason why the step pattern 240 having a relatively projected height is formed is that each substrate has height difference in each of regions, when bonding the first substrate 100 with the IC substrate 200 substantially. In case of forming them with a height of a typical pad electrode, communication with each other may be failed. To prevent this, the step pattern having 1~8 µm thickness may be formed.

Here, the second buffer layer 210 is formed on the IC substrate 200 to define a semiconductor layer of the IC substrate 200. When forming the semiconductor layer, the second buffer layer 210 protects the first substrate 100. Specifically, in the low temperature poly silicon forming process, the second buffer layer 210 protects the first substrate 100 from the laser crystallization or high heat application required in the poly silicon forming.

The laser crystallization is a method which applies a laser to the substrate having an amorphous silicon thin film layer deposited thereon to grow poly silicon. Rather than the laser crystallization, a metal-induced crystallization method may be used in the low poly silicon forming process. According to the metal-induced crystallization method, metal is deposited on amorphous silicon to form poly silicon.

A thin film layer transistor is fabricated in a glass substrate by using poly silicon and the thin film layer transistor forms a circuit of the IC substrate 200. At this time, a fabricating method of the poly silicon may include a low temperature process and a high temperature process based on a process temperature. The high temperature process requires a process temperature of approximately 1000° C. which is a transformation temperature of a heat-insulating substrate or higher. Since the glass substrate has deteriorating heat-resistance, a relatively expensive quartz substrate having good heat-resistance has to be used. In addition, a poly silicon thin film layer formed by the high temperature process has a disadvantage of deteriorating device applicability in comparison to poly silicon formed by the low temperature process, because of low quality crystallization such as a high surface roughness and fine grain size. Because of that, technology of forming poly silicon by using crystallization of amorphous silicon capable of being low temperature deposited has been under development.

Figure 3:
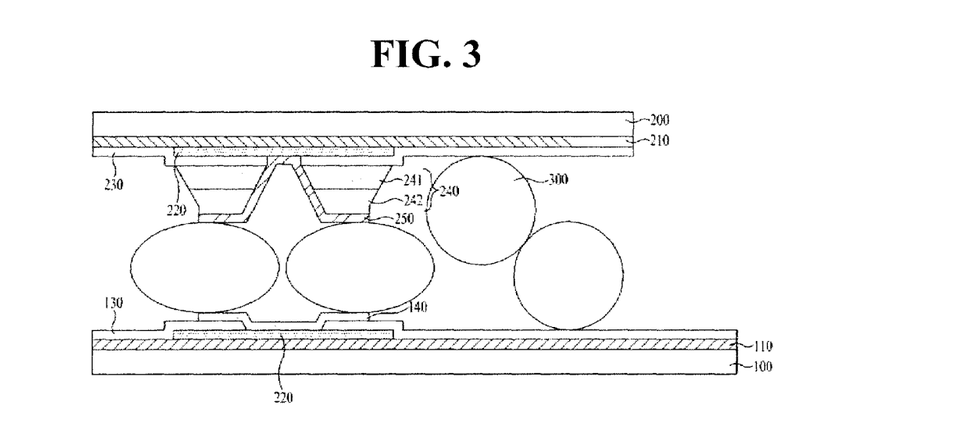
FIG. 3 is a sectional view illustrating a bonding state between the IC substrate and the substrate of the display device shown in FIGS. 2A and 2C.

FIG. 3 is a sectional view illustrating a bonding state between the IC substrate shown in FIGS. 2A and 2B with the first substrate of the display device.

As shown in FIG. 3, the step pattern of the IC substrate shown in FIG. 2B is opposed to the pad region of the display device shown in FIG. 2A correspondingly. The adhesive including the conductive ball is injected and bonded between the pad region and the step pattern/

Here, the conductive ball 300 is filled between the transparent circuit pad electrode 250 and the transparent pad electrode 140 to implement electrical connection, and the adhesive remains in the other region to adhere the IC substrate 200 to the pad part of the first substrate 100.

In this case, the conductive balls 300 remaining in the adhesive may not have electrical connection in the other region except the pad electrode region.

The metal pad electrode 120 and the circuit pad metal 220 are made of low-resistant metal, for example, Cu, Mo, Cr, Al, AlNd, AlMo and the like.

Here, the step pattern 240 has the thickness of approximately 1 μm~8 μm, preferably, 3 μm~5 μm. Because of such the step pattern 240, a projection is formed corresponding to the pad part of the first substrate 100 of the display device and the projection enables the pad part of the first substrate 100 and the IC substrate 200 to be electrically connected smoothly, when being physically opposed.

The transparent pad electrode 140 and the circuit transparent pad electrode 250 may be made of Indium In Oxide (ITO), Indium Zinc Oxide (IZO) and Indium Tin Zinc Oxide (ITZO), for example.

The conductive ball 300 is made of plastic spherical material plated with metal material having a high conductivity such as Nickel (Ni) and with Gold (Au) sequentially. Although not shown in the drawings, the conductive ball 300 is included in thermosetting resin and it is injected between the IC substrate 200 and the first substrate 100 to bond the two substrates with each other, as mentioned above.

That is, as shown in FIG. 3, the display device according to the present invention, has a center defined as display region and an outer portion defined as non-display region. The display region includes the thin film layer transistor array. The non-display region includes the first substrate 100 having the metal pad electrode 120 and the transparent pad electrode 140 connected with the metal pad electrode 120, the IC substrate 200 opposed to a predetermined portion of the non-display region of the first substrate 100, the circuit pad electrode 220 formed on the IC substrate 200, the step pattern 240 made of organic dielectric material formed on the circuit pad electrode 200, the circuit pad contact hole 245 formed in the step pattern to partially expose the circuit pad electrode 220, the transparent circuit pad electrode 250 formed on the step pattern 240 having the circuit pad contact hole 245, and the conductive adhesive formed between the first substrate 100 and the IC substrate 200, having the conductive balls 300 configured to electrically connect the transparent circuit pad electrode 250 and the transparent pad electrode 240 with each other.

The other configuration components including the first and second buffer layer 110 and 210, the passivation layer 130, the pad contact hole 135 and the inorganic dielectric layer 230 can be described in reference to what mentioned above.

Although not shown in the drawings, a second substrate (not shown) may be further provided, opposing to the display region of the first substrate 100. A color filter array is formed on the second substrate. This color filter array includes a black matrix layer configured to shut off lights of the other region except a pixel region on the second substrate, R, G and B color filter layers configured to present colors and a common electrode applied together with pixel electrodes of the first substrate to present images. These configuration forms the color filter array substrate.

The above first embodiment presents a method of improve the height corresponding to the pad part on the IC substrate. Depending on cases, it may be possible to change a height condition on the first substrate of the display device. As follows, this method will be described.

Second Embodiment

Figure 4:
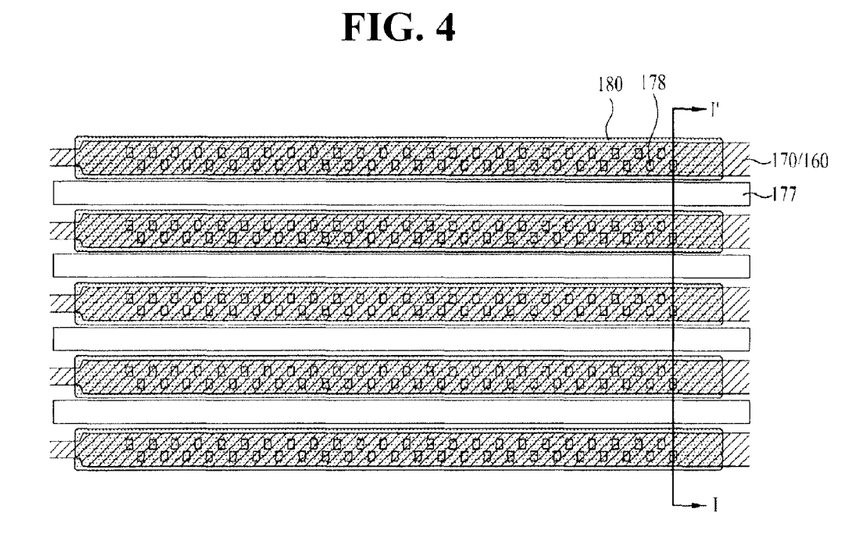
FIG. 4 is a plane view illustrating a first substrate of a display device according to a second embodiment of a pad part forming method of a display device.
Figure 5:
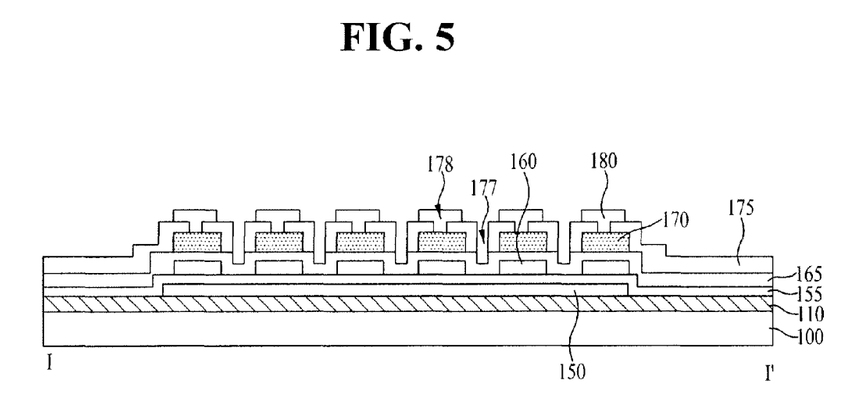
FIG. 5 is a sectional view illustrating a structure along I~I' line shown in FIG. 4.
Figure 6:
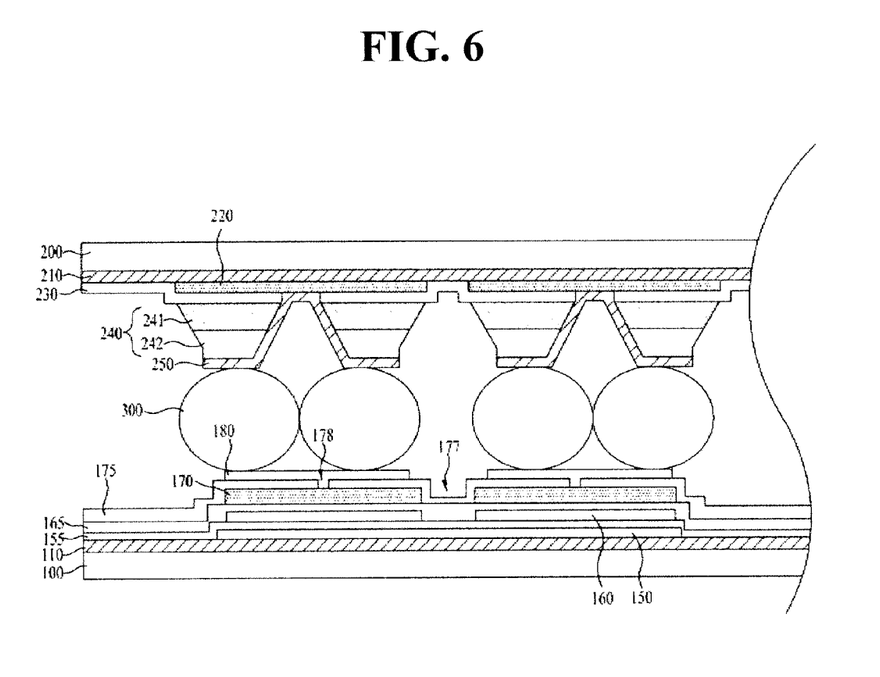
FIG. 6 is a sectional view illustrating a first substrate and a pad part of a display device by using the pad part forming method of the display device according to the second embodiment.
Figure 7A:
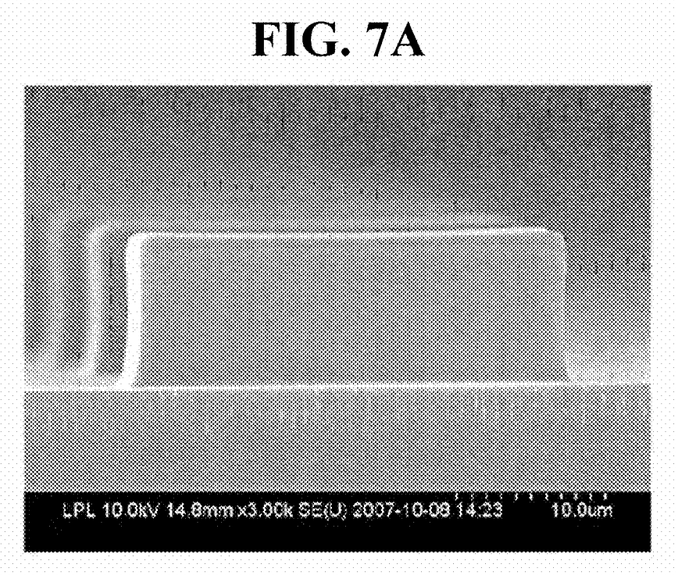
FIGS. 7A to 7D are SEM pictures showing heights of step patterns formed in the IC substrate, if the first embodiment of the present invention is applied.
Figure 7B:
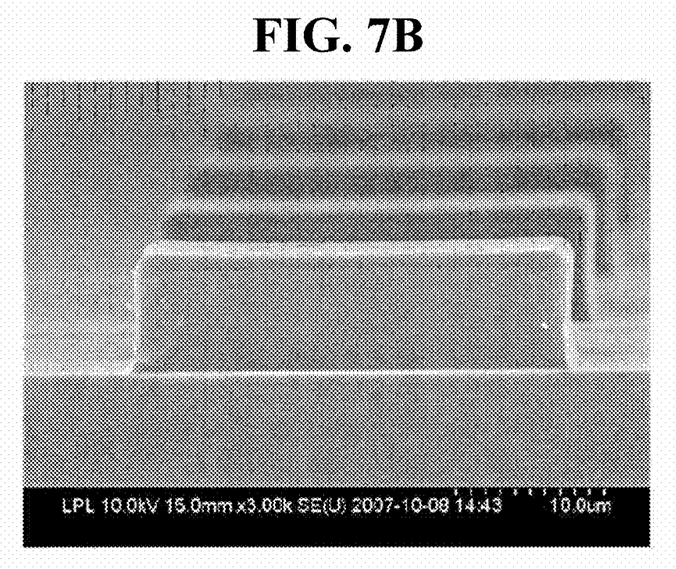
Figure 7C:
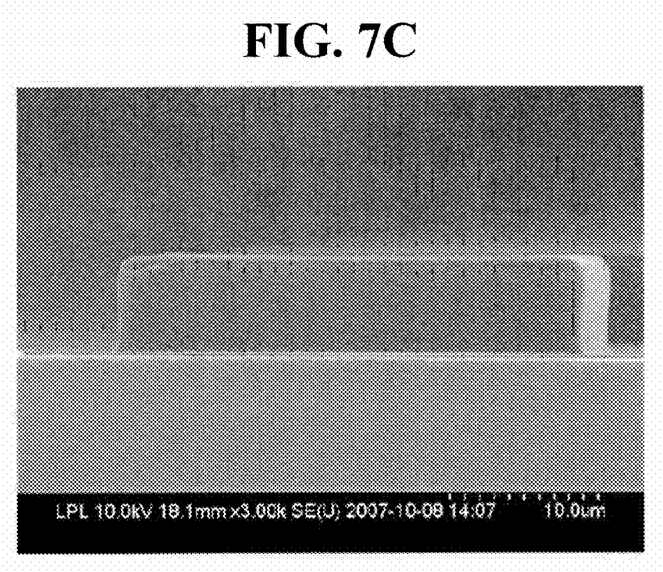
Figure 7D:
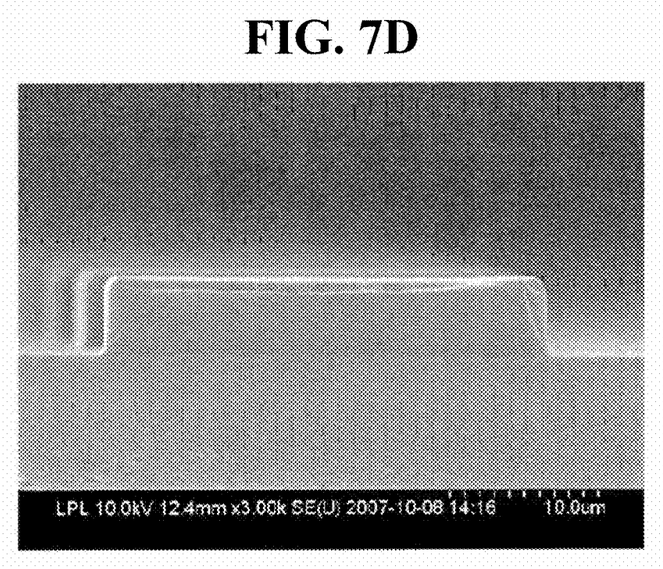

FIG. 4 is a diagram illustrating plane view illustrating a first substrate of a display device according to a pad part forming method of a display device according to a second embodiment of the present invention. FIG. 5 is a sectional view illustrating a structure along I~I' line shown in FIG. 4. FIG. 6 is a sectional view illustrating a forming state of the first substrate and a pad part of the display device based on the pad part forming method of the display device according to the second embodiment of the present invention.

As shown in FIGS. 4 and 5, the pad part forming method of the display device according to the second embodiment is implemented based on a following order.

First of all, a buffer layer 110 is formed on a first substrate 100.

Hence, a poly silicon dummy pattern 150 is formed in a predetermined area on the buffer layer 110. Depending on cases, the plurality of the poly silicon dummy patterns 150 may be formed in a metal pad electrode shape, not a single pattern. In this case, a relatively larger step may be expected.

After that, a gate dielectric layer 155 is formed on the buffer layer 110 including the poly silicon dummy pattern 150.

Hence, a plurality of gate dummy patterns 160 spaced apart a predetermined distance from each other, with identical layers to layers of gate lines (not shown), may be formed on the gate dielectric layer 155 to correspond a region above the poly silicon dummy pattern 150.

After that, an interlayer dielectric layer 165 is formed on the gate dummy patterns 160.

Then, a metal pad electrode 170 is formed on the interlayer dielectric layer 165, corresponding to a region above the gate dummy pattern 160. In this case, the metal pad electrode 170 is made of metal having identical layers to layers of data lines and the metal pad electrode 170 and the data lines may be formed in the same process.

Hence, a passivation layer 175 is deposited on a front surface having the metal pad electrode 170.

The deposited layer 175 is selectively eliminated to expose a predetermined area of the metal pad electrode 170. A pad contact hole 178 is formed in the area and a step generation hole 177 is formed in an area between each two of the gate dummy patterns 160, too.

Here, the gate dummy pattern 160 and the poly silicon dummy pattern may be formed in various polygonal shapes, including a rectangular shape and a square shape, or a circular shape and they may be formed along a direction of the metal pad electrode 170.

Hence, a transparent electrode is deposited on the passivation layer 175 having the pad contact hole 178 and the transparent electrode is selectively eliminated. A transparent pad electrode 180 is formed corresponding to an inner area of the pad contact hole 178 and an area adjacent the pad contact hole 178.

In this case, as shown in FIG. 5, the configuration of the IC substrate is identical to that of the IC substrate mentioned in reference to FIG. 2B. The first substrate 100 of the display device which has the step formed thereon by using the above dummy patterns is opposed to the IC substrate 200 formed by a glass substrate having a circuit formed therein. As shown in FIG. 6, the transparent pad metal 178 and the transparent circuit pad metal 250 are connected by the conductive balls 300.

Then, the poly silicon dummy pattern 150 is patterned together with the semiconductor layer and the gate dummy patterns 160 are patterned together when the gate lines are formed. The metal pad electrodes 170 are connected to ends of the data lines and they are formed in the identical layer. In this case, the metal pad electrodes 170 are used to apply signals to the data lines directly.

As shown in FIG. 4, the step generation holes 177 define spaces between each two of the gate dummy patterns 160, to generate the steps. The plurality of the pad contact holes 178 are provided for a single metal pad electrode such that the metal pad electrode and the transparent pad electrode connected via the pad contact holes 178 may maintain low resistance and enough conductivity.

In this case, according to the second embodiment, projections are provided in the first substrate of the display device by the steps. When this first substrate is opposed to the IC substrate having the step pattern formed in a multi-layer pattern of the organic dielectric layer, electrical connection may be implemented effectively.

In the meanwhile, it is possible to form the step pattern having the thickness of 3 μm or more on the first substrate by using the organic dielectric layer, like the first embodiment.

That is, according to the pad part forming method of the display device, when the IC substrate in which the low temperature poly silicon forming process is implemented and the first substrate of the display device are bonded, stable communication has to be achieved via the electrical contact of the IC substrate and the substrate of the display device. In this case, a method to be bonded with a conventional display panel (e.g. liquid crystal panel and organic luminescent display panel) made of amorphous silicon may be drawn. In addition, a structure capable of gain the required steps by forming the dummy patterns in the low temperature poly silicon forming process, without adding new processes may be drawn.

In the meanwhile, the height of the step pattern formed in the first embodiment of the present invention will be described.

FIGS. 7A to 7D are SEM diagrams illustrating the height of the step pattern formed in the IC substrate, when the first embodiment is applied.

FIGS. 7A to 7D are SEM pictures of the sections of the step patterns after a predetermined time period, with changing a organic coating speed in a predetermined rotation time into 250, 300, 400 and 500 rpm. According to the increase and decrease of RPM, the height of the step pattern may be 10.30 μm, 8.06 μm, 6.55 μm, 5.36 μm. That shows that the height is decreased. Rather than the height, it is identified that morphology has little change according to the change of rpm. That means that it is possible to form the organic step pattern with a desired height by increasing the speed. Also, as rpm is getting higher, the uniformity is getting improved more.

In this case, the step pattern is formed by spin-coating the organic dielectric layer one time or spin-coating the organic dielectric layer having double layers.

Figure 8:
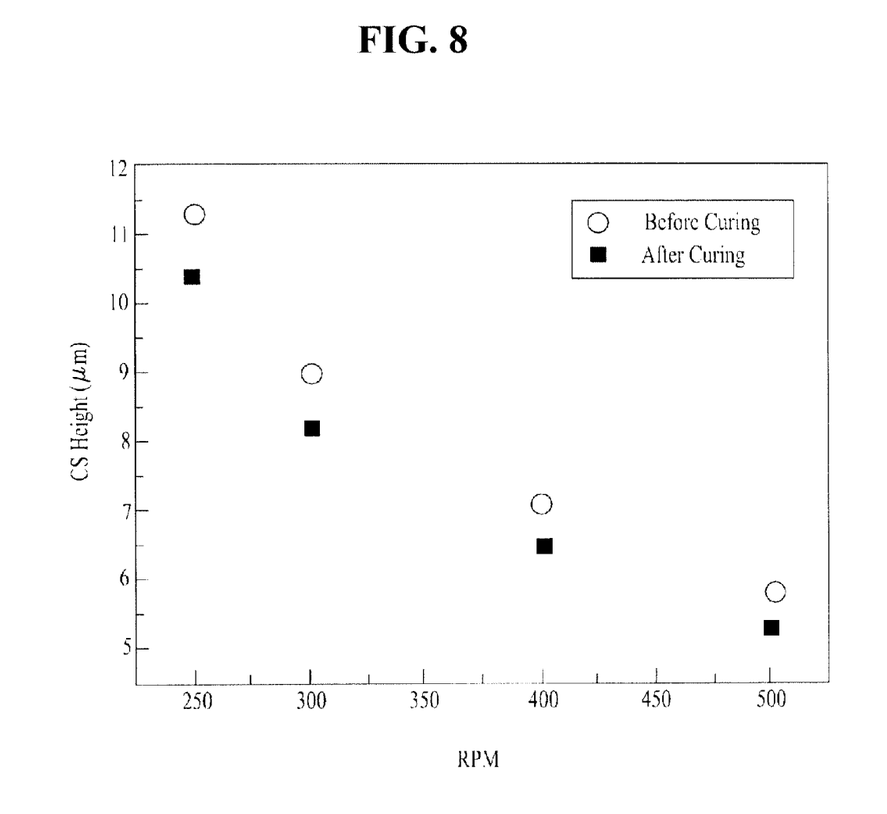
FIG. 8 is a graph measuring rpm speeds and heights of the step pattern formed in the IC substrate, if the first embodiment of the present invention is applied.

FIG. 8 is a graph to measure the height of the step pattern formed in the IC substrate before and after rpm speed change and curing, when the first embodiment of the present invention is applied.

As shown in FIG. 8, if the heights of the step pattern may be measured before and after the step pattern is cured, it is identified that the height is decreased after the curing approximately by 1 μm.

That means that it is possible to adjust the height of the step pattern by the curing as well as the speed of the coating.

When the first substrate of the display device the IC substrate are apposed to each other, the pattern is formed to generate steps on both of the substrates or at least one substrate and then the predetermined areas requiring electrical connection are projected without applying a large pressure. As a result, the bonding process may be implemented smoothly and efficiently.

Moreover, when forming the step pattern configured of the organic dielectric layer on the IC substrate as shown in the first embodiment, the step pattern may be formed with a predetermined level of uniformity. As a result, the connection uniformity of the pad part may be improved.

In the meanwhile, the IC substrate is corresponding to a pad terminal of the data lines formed on the first substrate of the display device. In this case, the gate pad part may include a gate drive IC embedded in the first substrate. Depending on cases, both of the gate pad part and the data pad part may be formed by using LDIC substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A display device comprising:
a first substrate comprising a display region defined in a center thereof and a non-display region defined in an outer area thereof, the display region comprising a thin film layer transistor array and the non-display region comprising a pad electrode;
an IC substrate opposed to a predetermined area of the non-display region;
a circuit pad electrode formed on the IC substrate;
a step pattern formed on the circuit pad electrode, the step pattern formed of an organic dielectric layer;
a circuit pad contact hole formed in the step pattern to partially expose the circuit pad electrode;
a transparent circuit pad electrode formed on the step pattern including the circuit pad contact hole; and
a conductive adhesive formed between the first substrate and the IC substrate, the conductive adhesive comprising conductive balls to electrically connect the transparent circuit pad electrode and the pad electrode with each other.

2. The display device of claim 1, wherein the step pattern is formed of multi-layered organic dielectric layer having double or more layers.

3. The display device of claim 2, wherein at least one of the double or more layers of the organic dielectric layer is made of photosensitive acryl resin.

4. The display device of claim 2, wherein one of the double or more layers of the organic dielectric layer is made of black matrix resin.

5. The display device of claim 2, wherein one of the double or more layers of the organic dielectric layer is color filter pigment.

6. The display device of claim 1, further comprising an inorganic dielectric layer formed under the step pattern, except the circuit pad contact hole.

7. The display device of claim 1, wherein the IC substrate is a glass substrate.

8. The display device of claim 1, further comprising:
a second substrate having a color filter array formed therein, opposing to the display region of the first substrate.

9. The display device of claim 1, wherein the pad electrode comprises a plurality of metal pad electrodes, a plurality of transparent pad electrodes connected with the metal pad electrodes, a pad contact hole formed in a connection area of an inter layer between the metal pad electrodes and the transparent pad electrodes, and a step generation hole formed between the metal pad electrodes.

10. The display device of claim 9, wherein a dummy poly silicon layer is formed below the metal pad electrodes and a plurality of gate dummy patterns are formed corresponding to the metal pad electrodes.

11. The display device of claim 10, wherein a gate dielectric layer is formed between the dummy poly silicon layer and the gate dummy patterns and an interlayer dielectric layer is formed between the gate dummy patterns and the metal pad electrodes.

12. The display device of claim 1, wherein the thickness of the step pattern is 1~8 μm.

13. A fabricating method of a display device comprising steps of:
preparing a first substrate comprising a display region defined in a center thereof and a non-display region defined in an outer area thereof, the display region comprising a thin film layer transistor array and the non-display region comprising a pad electrode;
preparing an IC substrate formed of a glass substrate;
forming a plurality of circuit pad electrodes on the IC substrate;
forming a step pattern made of an organic dielectric layer on each of the circuit pad electrodes and forming a circuit pad contact hole to each of the circuit pad electrodes partially;
forming transparent circuit pad electrodes on the step patterns having the circuit pad contact holes; and
coating conductive adhesive between the first substrate and the IC substrate to oppose the transparent circuit pad electrode to the pad electrode of the first substrate and to bond the first substrate with the IC substrate, the conductive adhesive comprising conductive balls to enable electrical connection.

14. The fabricating method of claim 13, wherein the step of forming the step pattern includes multi-layering double or more layers of an organic dielectric layer sequentially.

15. The fabricating method of claim 14, further comprising a step of forming an inorganic dielectric layer on the circuit pad electrodes, wherein the step pattern is below the double or more layers of the organic dielectric layer.

16. The fabricating method of claim 14, wherein at lease one of the double or more layers of the organic dielectric layer is made of photosensitive acryl resin.

17. The display device of claim 14, wherein one of the double or more layers of the organic dielectric layer is made of black matrix resin.

18. The display device of claim 14, wherein one of the double or more layers of the organic dielectric layer is color filter pigment.

19. The fabricating method of claim 13, further comprising steps of:
forming a dummy poly silicon layer below the pad electrodes on the first substrate;
forming a gate dielectric layer on the dummy poly silicon layer;
forming a plurality of gate dummy patterns on a predetermined area of the gate dielectric layer, correspondingly below the pad electrodes, the plurality of the gate dummy patterns spaced apart a predetermined distance from each other; and
forming an interlayer dielectric layer on the gate dielectric layer.

20. The fabricating method of claim 19, wherein the step of forming the pad electrodes comprises steps of:
forming a plurality of metal pad electrodes spaced apart a predetermined distance from each other on the interlayer dielectric layer, corresponding to the gate dummy patterns spaced a predetermined distance from each other;
depositing a passivation layer on the interlayer dielectric layer with the metal pad electrodes, and forming a pad contact hole to partially expose the metal pad electrode and a step generation hole to expose an area between each two of the metal pad electrodes; and
forming transparent pad electrodes connected with the metal pad electrodes in the pad contact holes.

* * * * *